United States Patent
Kawamoto et al.

(10) Patent No.: US 11,024,705 B2
(45) Date of Patent: Jun. 1, 2021

(54) SEMI-INSULATING GALLIUM ARSENIDE CRYSTAL SUBSTRATE

(71) Applicant: Sumitomo Electric Industries, Ltd., Osaka (JP)

(72) Inventors: Shinya Kawamoto, Osaka (JP); Makoto Kiyama, Osaka (JP); Yukio Ishikawa, Osaka (JP); Katsushi Hashio, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/607,211

(22) PCT Filed: Sep. 21, 2017

(86) PCT No.: PCT/JP2017/034096
§ 371 (c)(1),
(2) Date: Oct. 22, 2019

(87) PCT Pub. No.: WO2019/058483
PCT Pub. Date: Mar. 28, 2019

(65) Prior Publication Data
US 2020/0381509 A1    Dec. 3, 2020

(51) Int. Cl.
*H01L 29/04*    (2006.01)
*H01L 29/06*    (2006.01)
*H01L 29/20*    (2006.01)

(52) U.S. Cl.
CPC ........ *H01L 29/045* (2013.01); *H01L 29/0657* (2013.01); *H01L 29/20* (2013.01)

(58) Field of Classification Search
CPC ... H01L 29/045; H01L 29/0657; H01L 29/20; C30B 29/42
(Continued)

(56) References Cited

U.S. PATENT DOCUMENTS 5,047,370 A  †  9/1991  Yamamoto
5,182,233 A  *  1/1993  Inoue .................... H01L 21/304
83/35

(Continued)

FOREIGN PATENT DOCUMENTS

CN    103460349 A    12/2013
JP    S56-100410 A    8/1981
(Continued)

OTHER PUBLICATIONS

Stibal et al., "Contactless mapping of mesoscopic resistivity variations in semi-insulating substrates," Materials Science and Engineering B66 (1999) pp. 21-25.*

(Continued)

*Primary Examiner* — Jay C Kim
(74) *Attorney, Agent, or Firm* — Faegre Drinker Biddle & Reath LLP (57) ABSTRACT

A semi-insulating gallium arsenide crystal substrate has a main surface with a plane orientation of (100) and a diameter of 2R mm, the main surface having a specific resistance with an average value of $5 \times 10^7$ Ω·cm or more and with a standard deviation divided by the average value of the specific resistance, or with a coefficient of variation, of 0.50 or less in each of three measurement areas having their centers at distances of 0 mm, 0.5R mm, and (R-17) mm, respectively, from the center of the main surface in the [010] direction.

5 Claims, 4 Drawing Sheets

(58) Field of Classification Search
USPC .......................................................... 257/627
See application file for complete search history.

(56) References Cited

U.S. PATENT DOCUMENTS

| | | | | |
|---|---|---|---|---|
| 5,614,754 | A | * | 3/1997 | Inoue .................... H01L 43/065 |
| | | | | 257/421 |
| 6,229,197 | B1 | * | 5/2001 | Plumton et al. .. H01L 29/66318 |
| | | | | 257/627 |
| 6,297,523 | B1 | * | 10/2001 | Fujisaki .................. C30B 29/42 |
| | | | | 257/289 |
| 6,712,904 | B1 | | 3/2004 | Sonnenberg et al. |
| 8,652,253 | B2 | † | 2/2014 | Eichler |
| 2012/0292747 | A1 | | 11/2012 | Miyahara et al. |

FOREIGN PATENT DOCUMENTS

| | | | |
|---|---|---|---|
| JP | H04-215439 | A | 8/1992 |
| JP | H05178699 | A † | 7/1993 |
| JP | H08-188499 | A | 7/1996 |
| JP | H09-194300 | A | 7/1997 |
| JP | 2000-103699 | A | 4/2000 |
| JP | 2002-540051 | A | 11/2002 |
| JP | 2004-26584 | A | 1/2004 |
| WO | 2019/05848 | A1 † | 3/2019 |

OTHER PUBLICATIONS

Stibal et al., "Contactless evaluation of semi-insulating GaAs wafer resistivity using the time-dependent charge measurement," Semiconductor Science & Technology 6 (1991) pp. 995-1001.*
Wickert et al., "High Resolution EL2 and Resistivity Topography of SI GaAs Wafers," IEEE (1999) pp. 21-24.*
Jantz et al., "Nondestructive high resolution resistivity topography of semi-insulating GaAs and InP wafers," 7th Conference on Semi-Insulating Materials, Ixtapa, Mexico (1992) pp. 171-176.*
Kawase, Tomohiro et al., "Properties of 6-inch Semi-insulating GaAs Substrates Manufactured by Vertical Boat Method," GaAs ManTech, 1999, 5 pages.
Decision of Rejection dated Mar. 26, 2021 in Chinese patent application No. 201780094136.5 (with attached English-language translation).
Liu Fengwei, Knowledge of Rare Metals-Semiconductor Materials, Metallurgical Industry Press, p. 111, Aug. 1981.
Li Wei, Solar Cell Material and Application thereof, The University of Electronic Science and Technology Press, p. 166, Jan. 2014.

\* cited by examiner
† cited by third party

SEMI-INSULATING GALLIUM ARSENIDE CRYSTAL SUBSTRATE

TECHNICAL FIELD

The present invention relates to a semi-insulating gallium arsenide crystal substrate.

BACKGROUND ART

Semi-insulating compound semiconductor substrates such as a semi-insulating gallium arsenide crystal substrate are required to have a main surface improved in flatness in a microscopic area (hereinafter also referred to as micro-flatness) in order to contribute to making fine and complex a structure that directly improves semiconductor devices in performance. The micro flatness of the main surface of the substrate is affected not only by conditions applied in polishing the substrate but also by the substrate's physical properties. Specifically, in order to improve the micro flatness of the main surface of the substrate, it is important that the main surface of the substrate has a specific resistance uniformly distributed in a microscopic area (hereinafter also referred to as micro-distributed or the like).

From the viewpoint of obtaining a semi-insulating gallium arsenide substrate having a main surface with a specific resistance uniformly distributed in a microscopic area (or micro-distributed) and hence with high micro flatness, T. Kawase et al., "Properties of 6-Inch Semi-insulating GaAs Substrates Manufactured by Vertical Boat Method," GaAs ManTech1999, April, 1999, pp. 19-22 (Non-Patent Literature 1) discloses a semi-insulating gallium arsenide substrate in which a coefficient of variation of a specific resistance in microscopic areas located at a pitch of 100 μm from the center of the substrate toward the periphery of the substrate along a length of 80 mm is 0.073 (note that the coefficient of variation is obtained by dividing the standard deviation of the specific resistance in the microscopic area by the average value of the specific resistance in that area).

CITATION LIST

NON PATENT LITERATURE

NPL 1: T. Kawase et al., "Properties of 6-Inch Semi-insulating GaAs Substrates Manufactured by Vertical Boat Method," GaAs ManTech1999, April, 1999, pp. 19-22.

SUMMARY OF INVENTION

According to one aspect of the present disclosure, a semi-insulating gallium arsenide crystal substrate has a main surface with a plane orientation of (100) and a diameter of 2R mm, the main surface having a specific resistance with an average value of $5\times10^7$ Ω·cm or more and with a standard deviation divided by the average value of the specific resistance, or with a coefficient of variation, of 0.50 or less in each of three measurement areas having their centers at distances of 0 mm, 0.5R mm, and (R-17) mm, respectively, from the center of the main surface in the [010] direction.

DETAILED DESCRIPTION

Problem to be Solved by the Present Disclosure

The semi-insulating gallium arsenide substrate disclosed in T. Kawase et al., "Properties of 6-Inch Semi-insulating GaAs Substrates Manufactured by Vertical Boat Method," GaAs ManTech1999, April, 1999, pp. 19-22 (NPL 1), however, has a specific resistance having a maximum value of less than $5\times10^7$ Ω·cm, as read from a graph indicated in NPL 1 although the value is not explicitly indicated in the document. A semi-insulating gallium arsenide crystal substrate having a specific resistance larger than $5\times10^7$ Ω·cm has the specific resistance in a micro distribution significantly varying between the central portion of the substrate and the peripheral portion of the substrate, and it is thus difficult to make the specific resistance's micro distribution uniform, resulting in the main surface having low micro flatness, which is a problem.

An object of the present disclosure is to solve the above problem and provide a semi-insulating gallium arsenide crystal substrate having a main surface having high micro flatness even when it has high specific resistance.

Advantageous Effect of the Present Disclosure

According to the present disclosure, there can be provided a semi-insulating gallium arsenide crystal substrate having a main surface with high micro flatness even when it has high specific resistance.

Description of Embodiments

Initially, embodiments of the present invention are enumerated and described.

[1] According to one embodiment of the present invention, a semi-insulating gallium arsenide crystal substrate has a main surface with a plane orientation of (100) and a diameter of 2R mm, the main surface having a specific resistance with an average value of $5\times10^7$ Ω·cm or more and with a standard deviation divided by the average value of the specific resistance, or with a coefficient of variation, of 0.50 or less in each of three measurement areas having their centers at distances of 0 mm, 0.5R mm, and (R-17) mm, respectively, from the center of the main surface in the [010] direction. The semi-insulating gallium arsenide crystal substrate of the present embodiment has a main surface with a plane orientation of (100), that has a specific resistance uniformly micro-distributed and hence high micro flatness.

[2] In the above semi-insulating gallium arsenide crystal substrate, the diameter of 2R mm of the main surface can be 150 mm or more. Such a semi-insulating gallium arsenide crystal substrate has a main surface with a plane orientation of (100), that has a specific resistance uniformly micro-distributed and hence high micro flatness even when the main surface has a large diameter of 150 mm or more.

[3] In the above semi-insulating gallium arsenide crystal substrate, the coefficient of variation of the specific resistance can be 0.10 or less. Such a semi-insulating gallium arsenide crystal substrate has a main surface with a plane orientation of (100), that has a specific resistance extremely uniformly micro-distributed and hence extremely high micro flatness.

Detailed Description of Embodiments

Hereinafter, the present invention will be described more specifically in an embodiment, although the present invention is not limited thereto. In the following, while reference will be made to the drawings, identical or corresponding components in the present specification and figures are identically denoted and will not be described repeatedly in detail. In the present specification and drawings, (hkl) indicates plane orientation, and [hkl] indicates orientation. Herein, h, k and l are the same or different integers and referred to as Miller indices. A "-" that precedes a Miller index is originally indicated above a numerical character, and is read as "bar" after the Miller index. For example, [0-10] is read as "zero, one, bar, zero."

Furthermore, in the present specification, an expression in the form of "A-B" means a range's upper and lower limits (that is, A or more and B or less), and when A is not accompanied by any unit and B is alone accompanied by a unit, A has the same unit as B. Furthermore, in the present specification, when a compound or the like is represented by a chemical formula without specifying any specific atomic ratio, it includes any conventionally known atomic ratio and is not necessarily limited to what falls within a stoichiometric range.

<<Semi-Insulating Gallium Arsenide Crystal Substrate>>

Figure 1:
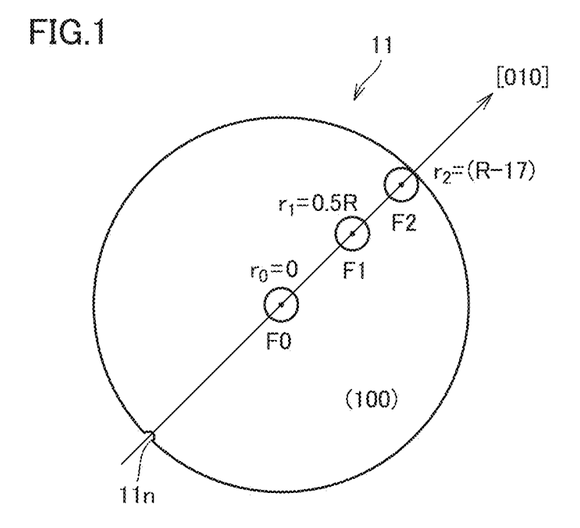
FIG. 1 is a schematic plan view showing an example of a semi-insulating gallium arsenide crystal substrate according to an embodiment.

Referring to FIG. 1, a semi-insulating GaAs crystal substrate 11 (a semi-insulating gallium arsenide crystal substrate) according to the present embodiment has a main surface with a plane orientation of (100) and a diameter of 2R mm, the main surface having a specific resistance with an average value of $5 \times 10^7$ Ω·cm or more and with a standard deviation divided by the average value of the specific resistance, or with a coefficient of variation, of 0.50 or less in each of three measurement areas having their centers at distances of 0 mm, 0.5R mm, and (R-17) mm, respectively, from the center of the main surface in the [010] direction. Semi-insulating GaAs crystal substrate 11 of the present embodiment has a main surface with a plane orientation of (100), that has a specific resistance uniformly micro-distributed and hence high micro flatness.

Semi-insulating GaAs crystal substrate 11 of the present embodiment has the specific resistance with an average of $5 \times 10^7$ Ω·cm or more, preferably $7.5 \times 10^7$ Ω·cm or more, more preferably $1.0 \times 10^8$ Ω·cm or more.

<Main Surface>

As shown in FIG. 1, semi-insulating GaAs crystal substrate 11 of the present embodiment has a main surface with a plane orientation of (100). That is, semi-insulating GaAs crystal substrate 11 is obtained by being cut out of a semi-insulating GaAs crystal body with its (100) plane as the main surface.

The main surface of semi-insulating GaAs crystal substrate 11 has a diameter of 2R mm, which is not particularly limited, although the larger, the more preferable, and 150 mm or more is preferable. Such a semi-insulating GaAs crystal substrate has a main surface with a plane orientation of (100), that has a specific resistance uniformly micro-distributed and hence high micro flatness even when the main surface has a large diameter of 150 mm or more.

<Specific Resistance's Average Value and Coefficient of Variation>

As shown in FIG. 1, semi-insulating GaAs crystal substrate 11 according to the present embodiment has a specific resistance with an average value of $5 \times 10^7$ Ω·cm or more and with a standard deviation divided by the average value of the specific resistance, or with a coefficient of variation, of 0.50 or less in each of three measurement areas having their centers at distances of 0 mm, 0.5R mm, and (R-17) mm, respectively, from the center of the main surface in the [010] direction. Semi-insulating GaAs crystal substrate 11 of the present embodiment having a specific resistance with a coefficient of variation, as described above, of 0.50 or less has a main surface with the specific resistance uniformly micro-distributed and hence with high micro flatness.

As shown in FIG. 1, the center of the main surface means the center of a circle when the main surface of semi-insulating GaAs crystal substrate 11 is assumed to be the circle. From the center of the main surface, the [010] direction, for a substrate having a notch 11n formed in the [0-10] direction from the center of the main surface, corresponds to a direction in which the center of the main surface is viewed from notch 11n.

The semi-insulating GaAs crystal substrate having a main surface with a diameter of 2R mm has three measurement areas for measuring specific resistance's micro distribution, as shown in FIG. 1, that is, a central measurement area F0 having a center at $r_0=0$ from the center of the main surface in the [010] direction, (that is, the point of the center of the main surface), an intermediate measurement area F1 having a center at $r_1=0.5R$ mm from the center of the main surface in the [010] direction (that is, a point intermediate between the center of the main surface and a periphery of the main surface), and a peripheral measurement area F2 having a center at $r_2=(R-17)$ mm from the center of the main surface in the [010] direction (that is, a point located at a distance of 17 mm inward from a periphery of the main surface).

The specific resistance is measured in central measurement area F0, intermediate measurement area F1, and peripheral measurement area F2 from the center of each area over a range of −5 mm to +5 mm in the [010] direction with a pitch of 100 μm (or 0.1 mm) for a total of 101 points. An average value of the specific resistance and a standard deviation of the specific resistance are calculated from the values of the specific resistance measured at the 101 points. A coefficient of variation of the specific resistance is calculated by dividing the obtained standard deviation of the specific resistance by the obtained average value of the specific resistance.

Figure 2:
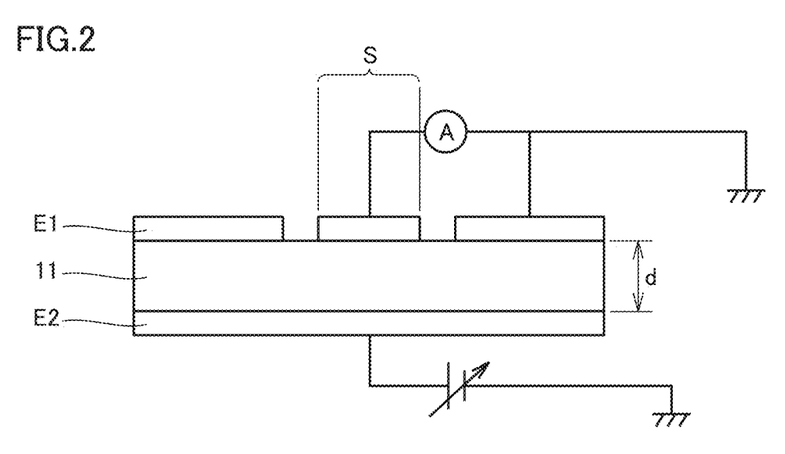
FIG. 2 is a schematic cross-sectional view showing an example of a method for measuring the specific resistance of the semi-insulating gallium arsenide crystal substrate according to the present embodiment.

The specific resistance is measured by a three-terminal guard method as shown in FIG. 2. That is, the main surface of semi-insulating GaAs crystal substrate 11 that is to be subjected to measurement of specific resistance (hereinafter also referred to as "the front main surface") undergoes photolithography to have a pattern formed thereon such that 101 circles having a diameter of 70 μm are disposed from the center of each of the three measurement areas in the [010] direction over a range of −5 mm to +5 mm with a pitch of 100 μm (or 0.1 mm). Subsequently, semi-insulating GaAs crystal substrate 11 is provided on the front main surface and a main surface thereof opposite to the front main surface (hereinafter also referred to as a back main surface) with an Au layer having a thickness of 300 nm, an Ni layer having a thickness of 40 nm, and an AuGe layer having a thickness of 80 nm sequentially through vapor deposition and lifted off, and thereafter heat-treated at 475° C. for 6 minutes and thus alloyed to form measurement electrodes E1 and E2. Measurement electrodes E1 and E2 are wired as shown in FIG. 2, and a voltage is applied from the back main surface in a range of 0 V to 10 V with a voltage application step of 1 V to measure a current in measurement electrode E1 patterned. Such measurement is performed for each measurement electrode E1 patterned in the [010] direction over a length of 10 mm with a pitch of 100 µm. A measured value of the specific resistance is derived as follows: a resistance value calculated from a gradient of a current-voltage curve is divided by a thickness d of a sample of semi-insulating GaAs crystal substrate 11 and subsequently multiplied by the area S of measurement electrode E1 patterned.

The specific resistance preferably has an average value of $5 \times 10^7$ Ω·cm or more in view of reducing a leakage current when fabricating a device. Furthermore, the specific resistance often has an average value of $1 \times 10^9$ Ω·cm or less, as derived from presentation of semi-insulation.

Semi-insulating GaAs crystal substrate 11 of the present embodiment preferably has a specific resistance with a coefficient of variation of 0.10 or less for each of the three measurement areas (i.e., central, intermediate, and peripheral measurement areas F0, F1, and F2). Such a semi-insulating GaAs crystal substrate having a specific resistance with a coefficient of variation of 0.10 or less has a main surface with the specific resistance micro-distributed extremely uniformly and hence with extremely high micro flatness.

<Dislocation Density>

Semi-insulating GaAs crystal substrate 11 of the present embodiment preferably has a dislocation density of $9.5 \times 10^3$ cm$^{-2}$ or less, more preferably $5.5 \times 10^3$ cm$^{-2}$ or less for each of the three measurement areas (i.e., central, intermediate, and peripheral measurement areas F0, F1, and F2) to allow the main surface to have a specific resistance uniformly micro-distributed.

Dislocation density is measured by measuring the density of etch pits formed when semi-insulating GaAs crystal substrate 11 is etched in molten KOH (potassium hydroxide) of 450° C. for 20 minutes. The density of etch pits is calculated by enlarging the center of each of the three measurement areas (central, intermediate, and peripheral measurement areas F0, F1, and F2) with a microscope, and counting the number of etch pits thereon in a field of view of 1 mm square.

<<Method of Manufacturing Semi-Insulating Gallium Arsenide Crystal Substrate>>

To allow a semi-insulating GaAs crystal substrate to have a specific resistance uniformly micro-distributed, it is important to make uniform a distribution of dislocation density affecting the specific resistance's micro distribution. A semi-insulating GaAs crystal substrate is typically manufactured by cutting out along the (100) plane and a plane parallel thereto a semi-insulating GaAs crystal body grown in the [100] direction and having a large diameter. The semi-insulating GaAs crystal body grown in the [100] direction and having a large diameter has at a cross section having a plane orientation of (100) a dislocation density unevenly distributed, that is, a dislocation density increased at the center and periphery of the cross section and decreased between the center and periphery thereof. Accordingly, it is necessary to make such an uneven dislocation density distribution uniform (an approach I). Further, due to GaAs crystal's crystallographic properties, semi-insulating GaAs crystal body tends to have high dislocation density in the <100> direction (collectively representing the [010] direction and the [00-1], [0-10] and [001] directions crystallographically equivalent to the [010] direction for a total of four directions). Accordingly, it is necessary to reduce the dislocation density in the <100> direction (an approach II). Further, it is preferable to make the above uneven dislocation density distribution uniform (approach I) and also reduce the dislocation density in the <100> direction (approach II) (an approach III).

<Approach I>

Figure 3:
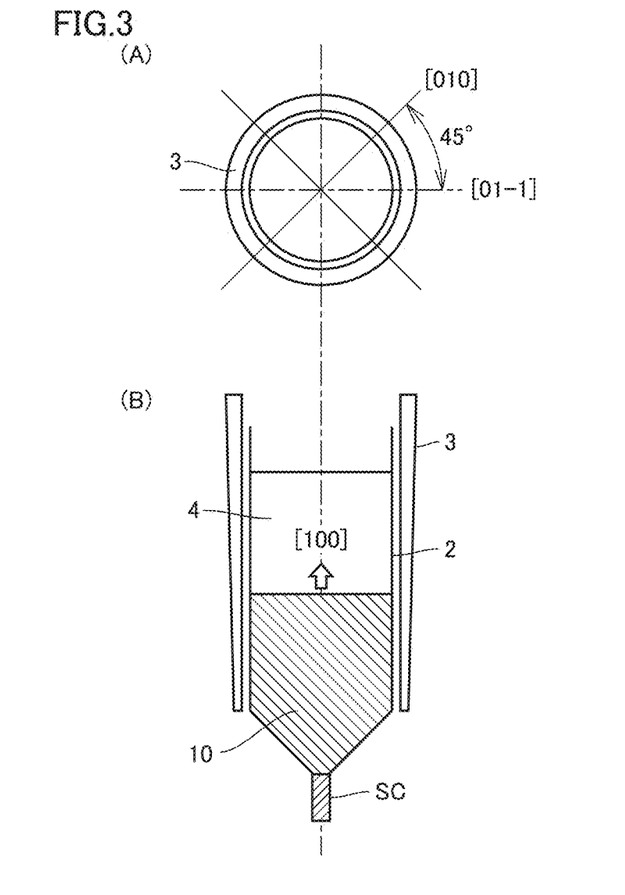
FIG. 3 is a schematic view showing an example of an apparatus used for manufacturing the semi-insulating gallium arsenide crystal substrate according to the present embodiment.

FIG. 3 shows a first example of an apparatus used for manufacturing a semi-insulating GaAs crystal body. FIG. 3(A) is a schematic top view of the apparatus, and FIG. 3(B) is a schematic sectional side view of the apparatus. The uneven dislocation density distribution is believed to be caused as heat radiated below from a solid-liquid interface between semi-insulating GaAs crystal body 10 in the course of its crystal growth and a melt 4 of a GaAs source material is reduced. That is, the radiation of heat downward from the solid-liquid interface is reduced as the solid-liquid interface rises and accordingly, the radiation of heat changes from radiation of heat from melt 4 of the GaAs source material directly to a stage (not shown), which is located below a crucible to support the crucible, to radiation of heat from melt 4 of the GaAs source material to the stage indirectly via semi-insulating GaAs crystal body 10. In a conventional method for manufacturing a semi-insulating GaAs crystal body, however, such a heat insulating material 3 as shown in FIG. 3 is not disposed, and heating from a heater (not shown) disposed on the side of a side surface of a crystal growth crucible 2 does not change while the solid-liquid interface rises. For this reason, in the conventional method for manufacturing a semi-insulating GaAs crystal body, the downward heat radiation decreases as the solid-liquid interface rises, so that when the heat input from the side surface remains constant, the heat balance between the heat input from the liquid phase of the solid-liquid interface and the heat radiated from the solid phase of the solid-liquid interface would be changed, and thermal stress is generated due to a change of the solid-liquid interface's relative position, shape and the like, resulting in an uneven dislocation density distribution. In the first example, as approach I, in order to provide a uniform dislocation density distribution by suppressing the change of the heat balance as described above, a tapered heat insulating material 3 is disposed between crystal growth crucible 2 and the heater, more specifically, to surround a side surface of crystal growth crucible 2.

Heat insulating material 3 in the first example has a cylindrical shape, and is tapered such that a portion thereof corresponding to the side of a crystal growth surface of a semi-insulating GaAs crystal body (hereinafter also referred to as a tail side) provides larger heat insulation than a portion thereof corresponding to the side of a GaAs seed crystal SC (hereinafter also referred to as a seed side). Heat insulating material 3 is not limited in material in particular, and for example includes carbon, boron nitride (BN), silicon nitride ($Si_3N_4$), mullite ($3Al_2O_3 \cdot 2SiO_2$ to $2Al_2O_3 \cdot SiO_2$), alumina ($Al_2O_3$), and the like. As a result, in the crystal growth of semi-insulating GaAs crystal body 10, as the solid-liquid interface rises, the heat input from the side of the side surface of crystal growth crucible 2 decreases and thereby the change in the heat balance is suppressed, so that thermal stress is suppressed and a uniform dislocation density distribution is provided.

<Approach II>

Figure 4:
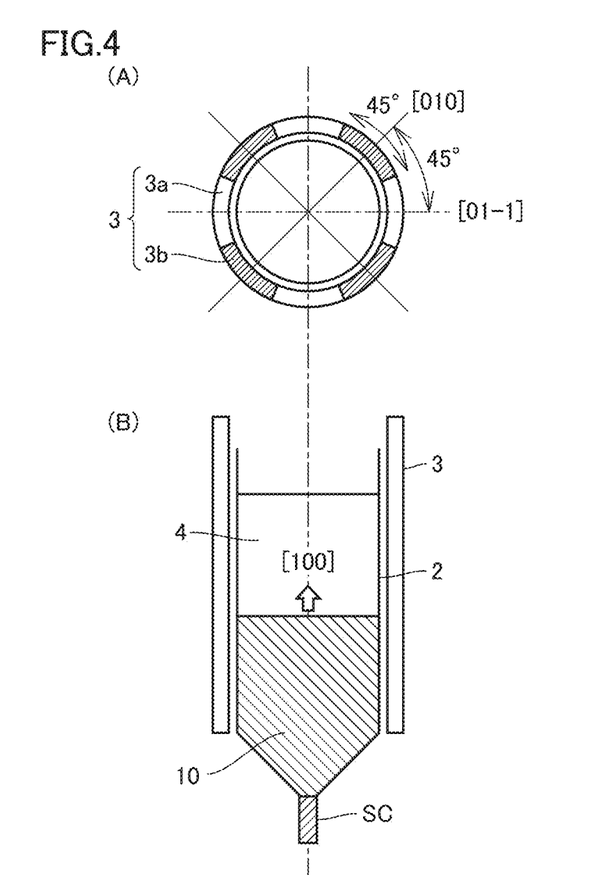
FIG. 4 is a schematic view showing another example of the apparatus used for manufacturing the semi-insulating gallium arsenide crystal substrate according to the present embodiment.

FIG. 4 shows a second example of the apparatus used for manufacturing a semi-insulating GaAs crystal body. FIG. 4(A) is a schematic top view of the apparatus, and FIG. 4(B) is a schematic sectional side view of the apparatus. Dislocation in semi-insulating GaAs crystal body 10 is believed to be caused by thermal stress, and in order to reduce dislocation density of semi-insulating GaAs crystal body 10 in the <100> direction, it is necessary to reduce a difference in temperature of semi-insulating GaAs crystal body 10 in the <100> direction. For this reason, in the second example, as approach II, heat insulating material 3 having a portion providing large heat insulation in the <100> direction of semi-insulating GaAs crystal body 10 (i.e., crystallographically equivalent, four directions including the [010] direction, more specifically, the [010], [00-1], [0-10] and [001] directions, which will be similarly discussed hereinafter) is disposed between crystal growth crucible 2 and the heater, more specifically, to surround a side surface of crystal growth crucible 2.

Heat insulating material 3 in the second example includes a first material 3a and a second material 3b made of a material providing larger heat insulation (or having a lower thermal conductivity) than first material 3a, disposed alternately by 45° circumferentially. Heat insulating material 3 is disposed such that crystal growth crucible 2 is surrounded by first material 3a and second material 3b disposed in the <110> direction (i.e., four crystallographically equivalent directions including the [01-1] direction, more specifically, the [01-1], [0-1-1], [0-11], and [011] directions, which will be similarly discussed hereinafter) and the <100> direction, respectively, of semi-insulating GaAs crystal body 10 grown in crystal growth crucible 2 in the [100] direction. First material 3a and second material 3b of heat insulating material 3 are not particularly limited as long as second material 3b is formed of a material providing larger heat insulation (or lower thermal conductivity) than first material 3a, and for example, first material 3a includes carbon and second material 3b includes boron nitride (BN), silicon nitride ($Si_3N_4$), mullite ($3Al_2O_3.2SiO_2$ to $2Al_2O_3.SiO_2$), alumina ($Al_2O_3$), and the like. Semi-insulating GaAs crystal body 10 is thus grown with a uniform temperature distribution in the <110> direction thereof, which suppresses thermal stress and provides a uniform dislocation density distribution.

<Approach III>

Figure 5:
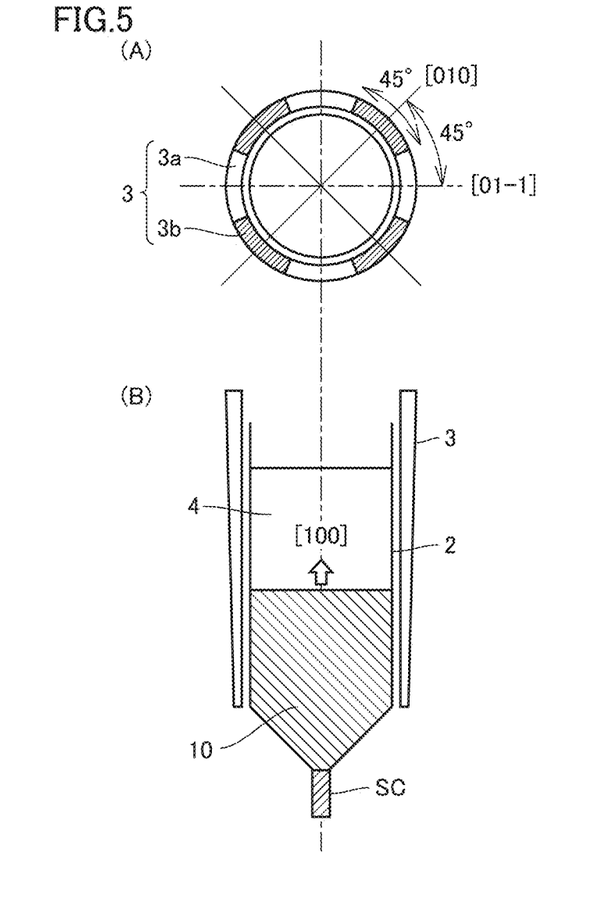
FIG. 5 is a schematic view showing still another example of the apparatus used for manufacturing the semi-insulating gallium arsenide crystal substrate according to the present embodiment.

FIG. 5 shows a third example of the apparatus used for manufacturing a semi-insulating GaAs crystal body. FIG. 5(A) is a schematic top view of the apparatus, and FIG. 5(B) is a schematic sectional side view of the apparatus. The third example is approach III combining approaches I and II, and tapered heat insulating material 3 having a portion providing large heat insulation in the <100> direction of semi-insulating GaAs crystal body 10 is disposed between crystal growth crucible 2 and the heater, more specifically, to surround a side surface of crystal growth crucible 2.

Heat insulating material 3 in the third example takes approach I, that is, has a cylindrical shape and is tapered such that a portion thereof corresponding to the side of a crystal growth surface of a semi-insulating GaAs crystal body (hereinafter also referred to as a tail side) provides larger heat insulation than a portion thereof corresponding to the side of GaAs seed crystal SC (hereinafter also referred to as a seed side), and also takes approach II, that is, is formed of first material 3a and second material 3b made of a material providing larger heat insulation (or having a lower thermal conductivity) than first material 3a, disposed alternately by 45° circumferentially, and is disposed such that crystal growth crucible 2 is surrounded by first and second materials 3a and 3b disposed in the <110> and <100> directions, respectively, of semi-insulating GaAs crystal body 10 grown in crystal growth crucible 2 in the [100] direction. First material 3a and second material 3b of heat insulating material 3 are not particularly limited as long as second material 3b is formed of a material providing larger heat insulation (or lower thermal conductivity) than first material 3a, and for example, first material 3a includes carbon and second material 3b includes boron nitride (BN), silicon nitride ($Si_3N_4$), mullite ($3Al_2O_3.2SiO_2$ to $2Al_2O_3.SiO_2$), alumina ($Al_2O_3$), and the like.

In the third example, by the configuration corresponding to approach I, in the crystal growth of semi-insulating GaAs crystal body 10, as the solid-liquid interface rises, endotherm from the side of the side surface of crystal growth crucible 2 decreases, which suppresses change in heat balance and hence suppresses thermal stress, and by the configuration corresponding to approach II, semi-insulating GaAs crystal body 10 is grown with a uniform temperature distribution in the <110> direction thereof, which suppresses thermal stress. This provides a further uniform dislocation density distribution.

From semi-insulating GaAs crystal body 10 obtained by the manufacturing methods of the first to third examples, semi-insulating GaAs crystal substrate 11 as described above can be manufactured by being cut out of the crystal with the crystal's (100) plane as a main surface of the substrate.

EXAMPLE

Example I

<Manufacturing Semi-Insulating GaAs Crystal Substrate>

In Example I, by using the apparatus shown in FIG. 3, semi-insulating GaAs crystal body 10 doped with carbon and having a large diameter of 150 mm was grown by the vertical boat growth. Heat insulating material 3 had a cylindrical shape, and was tapered such that a portion thereof corresponding to the side of a crystal growth surface of the semi-insulating GaAs crystal body (hereinafter also referred to as a tail side) provided larger heat insulation than a portion thereof corresponding to the side of GaAs seed crystal SC (hereinafter also referred to as a seed side), more specifically, such that heat insulating material 3 was larger in thickness on the tail side than the seed side. Heat insulating material 3 was made of silicon nitride ($Si_3N_4$). Semi-insulating GaAs crystal body 10 was grown under conditions in a routine procedure. The semi-insulating GaAs crystal body of Example I was thus manufactured.

From the thus manufactured semi-insulating GaAs crystal body, a plurality of semi-insulating GaAs crystal substrates having a thickness of 600 µm were manufactured by being cut out of the crystal with the crystal's (100) plane as a main surface of each substrate. Of the plurality of manufactured semi-insulating GaAs crystal substrates, a semi-insulating GaAs crystal substrate obtained from a portion of semi-insulating GaAs crystal body 10 closest to GaAs seed crystal SC (hereinafter also referred to as "closest to the seed") was served as a semi-insulating GaAs crystal substrate for Example I-1, and a semi-insulating GaAs crystal substrate obtained from a portion of semi-insulating GaAs crystal body 10 closest to the crystal growth surface thereof (hereinafter also referred to as "closest to the tail") was served as a semi-insulating GaAs crystal substrate for Example I-2.

<Evaluating Specific Resistance's Average Value and Coefficient of Variation, and Dislocation Density>

The semi-insulating GaAs crystal substrates of Example I-1 (closest to the seed) and Example I-2 (closest to the tail) manufactured as described above had their main surfaces' above-described three measurement areas (i.e., central, intermediate, and peripheral measurement areas F0, F1, and F2) each subjected in the above-described method to measurement of specific resistance's average value and coefficient of variation and dislocation density serving as an index of specific resistance's micro distribution to evaluate the specific resistance's average value and coefficient of variation and the dislocation density in each of the three measurement areas. A result is shown in table 1.

<Evaluating Surface Flatness>

The semi-insulating GaAs crystal substrates of Example I-1 (closest to the seed) and Example I-2 (closest to the tail) manufactured as described above had their main surfaces' above-described three measurement areas (i.e., central, intermediate, and peripheral measurement areas F0, F1, and F2) each subjected to measurement of surface flatness for evaluation. The measurement was done in the following method: The semi-insulating GaAs crystal substrates of Example I-1 and Example I-2 had their main surfaces mirror-processed. A range of 20 mm square of each of central, intermediate and peripheral measurement areas F0, F1 and F2 having a center at that of the measurement area was subjected to LTV (Local Thickness Variation) measurement using a flatness measuring instrument (UltraSort 6220 by Corning Tropel) in each 20-mm-square area. A result is shown in table 1.

Example II

<Manufacturing Semi-Insulating GaAs Crystal Substrate>

In Example II, by using the apparatus shown in FIG. 4, semi-insulating GaAs crystal body 10 doped with carbon and having a large diameter of 150 mm was grown by vertical bridgman growth. Heat insulating material 3 had a cylindrical shape and was composed of first material 3a and second material 3b made of a material providing larger heat insulation (or having a lower thermal conductivity) than first material 3a, disposed alternately by 45° circumferentially, and first material 3a was made of carbon and second material 3b was made of silicon nitride ($Si_3N_4$). Further, heat insulating material 3 was disposed such that crystal growth crucible 2 was surrounded by first and second materials 3a and 3b disposed to have their respective central axes extending in the <110> and <100> directions, respectively, of semi-insulating GaAs crystal body 10 grown in crystal growth crucible 2 in the [100] direction. The semi-insulating GaAs crystal body of Example II was thus manufactured.

From the thus manufactured semi-insulating GaAs crystal body of Example II, a plurality of semi-insulating GaAs crystal substrates having a thickness of 600 μm were manufactured by being cut out of the crystal, as done in Example I. Of the plurality of manufactured semi-insulating GaAs crystal substrates, a semi-insulating GaAs crystal substrate obtained from a portion of semi-insulating GaAs crystal body 10 closest to the seed was served as a semi-insulating GaAs crystal substrate for Example II-1, and a semi-insulating GaAs crystal substrate obtained from a portion of semi-insulating GaAs crystal body 10 closest to the tail was served as a semi-insulating GaAs crystal substrate for Example II-2.

<Evaluating Specific Resistance's Average Value and Coefficient of Variation, Dislocation Density, and Surface Flatness>

The semi-insulating GaAs crystal substrates of Example II-1 (closest to the seed) and Example II-2 (closest to the tail) manufactured as described above had their main surfaces' above-described three measurement areas (i.e., central, intermediate, and peripheral measurement areas F0, F1, and F2) each subjected to evaluation of specific resistance's average value and coefficient of variation, dislocation density, and surface flatness, as done in Example I. A result is shown in table 1.

Example III

<Manufacturing Semi-Insulating GaAs Crystal Substrate>

In Example III, by using the apparatus shown in FIG. 5, semi-insulating GaAs crystal body 10 doped with carbon and having a large diameter of 150 mm was grown by vertical bridgman growth. Heat insulating material 3 had a cylindrical shape, and was tapered such that a portion thereof corresponding to the side of a crystal growth surface of the semi-insulating GaAs crystal body (hereinafter also referred to as a tail side) provided larger heat insulation than a portion thereof corresponding to the side of GaAs seed crystal SC (hereinafter also referred to as a seed side), more specifically, such that heat insulating material 3 was larger in thickness on the tail side than the seed side. Furthermore, heat insulating material 3 was formed of first material 3a and second material 3b made of a material providing larger heat insulation (or having a lower thermal conductivity) than first material 3a, disposed alternately by 45° circumferentially, and first material 3a was made of carbon and second material 3b was made of silicon nitride ($Si_3N_4$). Further, heat insulating material 3 was disposed such that crystal growth crucible 2 was surrounded by first and second materials 3a and 3b disposed to have their respective central axes extending in the <110> and <100> directions, respectively, of semi-insulating GaAs crystal body 10 grown in crystal growth crucible 2 in the [100] direction. The semi-insulating GaAs crystal body of Example III was thus manufactured.

From the thus manufactured semi-insulating GaAs crystal body of Example III, a plurality of semi-insulating GaAs crystal substrates having a thickness of 600 μm were manufactured by being cut out of the crystal, as done in Example I. Of the plurality of manufactured semi-insulating GaAs crystal substrates, a semi-insulating GaAs crystal substrate obtained from a portion of semi-insulating GaAs crystal body 10 closest to the seed was served as a semi-insulating GaAs crystal substrate for Example III-1, and a semi-insulating GaAs crystal substrate obtained from a portion of semi-insulating GaAs crystal body 10 closest to the tail was served as a semi-insulating GaAs crystal substrate for Example III-2.

<Evaluating Specific Resistance's Average Value and Coefficient of Variation, Dislocation Density, and Surface Flatness>

The semi-insulating GaAs crystal substrates of Example III-1 (closest to the seed) and Example III-2 (closest to the tail) manufactured as described above had their main surfaces' above-described three measurement areas (i.e., central, intermediate, and peripheral measurement areas F0, F1, and F2) each subjected to evaluation of specific resistance's average value and coefficient of variation, dislocation density, and surface flatness, as done in Example I. A result is shown in table 1.

Comparative Example I

A semi-insulating GaAs crystal body for Comparative Example I was manufactured in the same manner as Example I, except that no heat insulating material was used. From the thus manufactured semi-insulating GaAs crystal body of Comparative Example I, a plurality of semi-insulating GaAs crystal substrates having a thickness of 600 μm were manufactured by being cut out of the crystal, as done in Example I. Of the plurality of manufactured semi-insulating GaAs crystal substrates, a semi-insulating GaAs crystal substrate obtained from a portion of semi-insulating GaAs crystal body 10 closest to the seed was served as a semi-insulating GaAs crystal substrate for Comparative Example I-1, and a semi-insulating GaAs crystal substrate obtained from a portion of semi-insulating GaAs crystal body 10 closest to the tail was served as a semi-insulating GaAs crystal substrate for Comparative Example I-2. The semi-insulating GaAs crystal substrates of Comparative Example I-1 (closest to the seed) and Comparative Example I-2 (closest to the tail) manufactured had their main surfaces' above-described three measurement areas (i.e., central, intermediate, and peripheral measurement areas F0, F1, and F2) each subjected to evaluation of specific resistance's average value and coefficient of variation, dislocation density, and surface flatness, as done in Example I. A result is shown in table 1.

GaAs crystal substrates of Examples I-1 and I-2 manufactured with approach I applied had their main surfaces with the central, intermediate, and peripheral measurement areas all having a specific resistance with an average value of $5.0 \times 10^7$ Ω·cm or more and a coefficient of variation of 0.39 or less, which was below 0.50, a dislocation density of $8.6 \times 10^3$ cm$^{-2}$ or less, which was below $9.5 \times 10^3$ cm$^{-2}$, and a surface flatness of 0.8 μm or less, which was also small. That is, Examples I-1 and I-2 with approach I applied provided a semi-insulating GaAs crystal substrate having a main surface having a specific resistance uniformly micro-distributed and hence high micro-flatness.

Note that the semi-insulating GaAs crystal substrate of Example I-1 was cut out of a portion of the semi-insulating GaAs crystal body of Example I closest to the seed side, and accordingly, the semi-insulating GaAs crystal substrate of Example I-1 had a main surface corresponding to a cross section of the semi-insulating GaAs crystal body of Example I closest to the seed side. Furthermore, the semi-insulating GaAs crystal substrate of Example I-2 was cut out of a portion of the semi-insulating GaAs crystal body of Example I closest to the tail side, and accordingly, the semi-insulating GaAs crystal substrate of Example I-2 had a main surface corresponding to a cross section of the semi-insulating GaAs crystal body of Example I closest to the tail side. Accordingly, the results for the main surfaces of Examples I-1 and I-2 corresponded to those for the cross sections of the semi-insulating GaAs crystal body of Example I closest to the seed and tail sides, respectively. That is, Example I with approach I applied provided a

TABLE 1

| | | | comp. ex. I-1 | comp. ex. I-2 | ex. I-1 | ex. I-2 | ex. II-1 | ex. II-2 | ex. III-1 | ex. III-2 |
|---|---|---|---|---|---|---|---|---|---|---|
| manufacturing apparatus | | | conventional | conventional | approach 1 | approach 1 | approach 2 | approach 2 | approach 3 | approach 3 |
| semi-insulating GaAs crystal substrate | | | closest to seed | closest to tail | closest to seed | closest to tail | closest to seed | closest to tail | closest to seed | closest to tail |
| central measurement area | specific resistance | average value (Ω · cm) | $1.0 \times 10^8$ | $2.8 \times 10^8$ | $1.0 \times 10^8$ | $1.7 \times 10^8$ | $1.0 \times 10^8$ | $1.7 \times 10^8$ | $1.1 \times 10^8$ | $1.5 \times 10^8$ |
| | | coefficient of variation | 0.55 | 0.54 | 0.28 | 0.30 | 0.29 | 0.33 | 0.08 | 0.08 |
| | dislocation density (cm$^{-2}$) | | $1.0 \times 10^4$ | $1.4 \times 10^4$ | $7.0 \times 10^3$ | $7.7 \times 10^3$ | $6.8 \times 10^3$ | $9.0 \times 10^3$ | $4.5 \times 10^3$ | $4.9 \times 10^3$ |
| | surface flatness [LTV] (μm) | | 1.1 | 1.3 | 0.7 | 0.8 | 0.6 | 0.7 | 0.5 | 0.4 |
| intermediate measurement area | specific resistance | average value (Ω · cm) | $9.5 \times 10^7$ | $3.7 \times 10^8$ | $1.1 \times 10^8$ | $2.0 \times 10^8$ | $1.2 \times 10^8$ | $1.8 \times 10^8$ | $1.2 \times 10^8$ | $1.4 \times 10^8$ |
| | | coefficient of variation | 0.30 | 0.31 | 0.29 | 0.29 | 0.31 | 0.28 | 0.09 | 0.09 |
| | dislocation density (cm$^{-2}$) | | $6.3 \times 10^3$ | $7.6 \times 10^3$ | $6.0 \times 10^3$ | $7.4 \times 10^3$ | $5.5 \times 10^3$ | $6.3 \times 10^3$ | $4.2 \times 10^3$ | $4.5 \times 10^3$ |
| | surface flatness [LTV](μm) | | 0.7 | 0.7 | 0.6 | 0.7 | 0.5 | 0.6 | 0.4 | 0.5 |
| peripheral measurement area | specific resistance | average value (Ω · cm) | $8.7 \times 10^7$ | $3.0 \times 10^8$ | $9.0 \times 10^7$ | $1.7 \times 10^8$ | $9.8 \times 10^7$ | $1.3 \times 10^8$ | $1.1 \times 10^8$ | $1.4 \times 10^8$ |
| | | coefficient of variation | 0.61 | 0.58 | 0.39 | 0.29 | 0.42 | 0.40 | 0.05 | 0.06 |
| | dislocation density (cm$^{-2}$) | | $1.4 \times 10^4$ | $1.1 \times 10^4$ | $7.0 \times 10^3$ | $8.6 \times 10^3$ | $6.5 \times 10^3$ | $8.7 \times 10^3$ | $5.2 \times 10^3$ | $5.3 \times 10^3$ |
| | surface flatness [LTV] (μm) | | 1.3 | 1.0 | 0.8 | 0.8 | 0.8 | 0.8 | 0.5 | 0.5 |

With reference to Table 1, the semi-insulating GaAs crystal substrates of comparative examples I-1 and I-2 had main surfaces in which while the central, intermediate, and peripheral measurement areas all had a specific resistance with an average value of $5.0 \times 10^7$ Ω·cm or more, the central and peripheral measurement areas had the specific resistance with a coefficient of variation exceeding 0.50, a dislocation density of $1.0 \times 10^4$ cm$^{-2}$ or more, and a surface flatness of 1.0 μm or more, which was also large.

In contrast to the semi-insulating GaAs crystal substrates of comparative examples I-1 and I-2, the semi-insulating semi-insulating GaAs crystal body having in cross section a specific resistance uniformly micro-distributed and hence high micro-flatness.

In contrast to the semi-insulating GaAs crystal substrates of Comparative Examples I-1 and I-2, the semi-insulating GaAs crystal substrates of examples II-1 and II-2 with approach II applied had main surfaces with the central, intermediate, and peripheral measurement areas all having a specific resistance with an average value of $5.0 \times 10^7$ Ω·cm or more and a coefficient of variation of 0.42 or less, which was below 0.50, a dislocation density of $9.0 \times 10^3$ cm$^{-2}$ or less, which was below $9.5\times10^3$ cm$^{-2}$, and a surface flatness of 0.8 μm or less, which was also small. That is, Examples II-1 and II-2 with approach II applied provided a semi-insulating GaAs crystal substrate having a main surface having a specific resistance uniformly micro-distributed and hence high micro-flatness.

Note that the semi-insulating GaAs crystal substrate of Example II-1 was cut out of a portion of the semi-insulating GaAs crystal body of Example II closest to the seed side, and accordingly, the semi-insulating GaAs crystal substrate of Example II-1 had a main surface corresponding to a cross section of the semi-insulating GaAs crystal body of Example II closest to the seed side. Furthermore, the semi-insulating GaAs crystal substrate of Example II-2 was cut out of a portion of the semi-insulating GaAs crystal body of Example II closest to the tail side, and accordingly, the semi-insulating GaAs crystal substrate of Example II-1 had a main surface corresponding to a cross section of the semi-insulating GaAs crystal body of Example II closest to the tail side. Accordingly, the results for the main surfaces of Examples II-1 and II-2 corresponded to those for the cross sections of the semi-insulating GaAs crystal body of Example II closest to the seed and tail sides, respectively. That is, Example II with approach II applied provided a semi-insulating GaAs crystal body having in cross section a specific resistance uniformly micro-distributed and hence high micro-flatness.

In contrast to the semi-insulating GaAs crystal substrates of Comparative Examples I-1 and I-2, the semi-insulating GaAs crystal substrates of examples III-1 and III-2 with approach III applied had main surfaces with the central, intermediate, and peripheral measurement areas all having a specific resistance with an average value of $5.0\times10^7$ Ω·cm or more and a coefficient of variation of 0.10 or less, a dislocation density of $5.5\times10^3$ cm$^{-2}$ or less, and a surface flatness of 0.5 μm or less, which was also extremely small. That is, Examples III-1 and III-2 with approach III applied provided a semi-insulating GaAs crystal substrate having a main surface having a specific resistance extremely uniformly micro-distributed and hence extremely high micro-flatness.

Note that the semi-insulating GaAs crystal substrate of Example III-1 was cut out of a portion of the semi-insulating GaAs crystal body of Example III closest to the seed side, and accordingly, the semi-insulating GaAs crystal substrate of Example III-1 had a main surface corresponding to a cross section of the semi-insulating GaAs crystal body of Example III closest to the seed side. Furthermore, the semi-insulating GaAs crystal substrate of Example III-2 was cut out of a portion of the semi-insulating GaAs crystal body of Example III closest to the tail side, and accordingly, the semi-insulating GaAs crystal substrate of Example III-2 had a main surface corresponding to a cross section of the semi-insulating GaAs crystal body of Example III closest to the tail side. Accordingly, the results for the main surfaces of Examples III-1 and III-2 corresponded to those for the cross sections of the semi-insulating GaAs crystal body of Example III closest to the seed and tail sides, respectively. That is, Example III with approach III applied provided a semi-insulating GaAs crystal body having in cross section a specific resistance extremely uniformly micro-distributed and hence extremely high micro-flatness.

It should be understood that the embodiment and example disclosed herein have been described for the purpose of illustration only and in a non-restrictive manner in any respect. The scope of the present invention is defined by the terms of the claims, rather than the embodiments and examples described above, and is intended to include any modifications within the meaning and scope equivalent to the terms of the claims.

REFERENCE SIGNS LIST

2 crystal growth crucible, 3 heat insulating material, 3a first material, 3b second material, 4 melt of source material of GaAs, 10 semi-insulating GaAs crystal body, 11 semi-insulating GaAs crystal substrate, 11n notch, E1, E2 measurement electrode, F0 central measurement area, F1 intermediate measurement area, F2 peripheral measurement area, SC GaAs seed crystal.

The invention claimed is:

1. A semi-insulating gallium arsenide crystal substrate having a main surface with a plane orientation of (100) and a diameter of 2R mm,
   the diameter of 2R mm of the main surface being 150 mm or more,
   the main surface being a circle in a plan view of the semi-insulating gallium arsenide crystal substrate, and a center of the circle being a center of the main surface,
   the main surface having a first measurement area, a second measurement area, and a third measurement area for measuring specific resistance of the main surface, each of the measurement areas being circular in shape,
   a center of the first measurement area corresponding to the center of the main surface,
   a center of the second measurement area being at a distance of 0.5R mm from the center of the main surface in the [010] direction,
   a center of the third measurement area being at a distance of (R−17) mm from the center of the main surface in the [010] direction,
   each of the first, second, and third measurement areas of the main surface including 101 points at which specific resistance is measured, each point being disposed from the center of the respective measurement area in the [010] direction over a range of −5 mm to +5 mm at 100 μm intervals,
   for each of the first, second, and third measurement areas: (i) an average value of the specific resistance measured at the 101 points is $5\times10^7$ Ω·cm or more, and (ii) a coefficient of variation of the specific resistance is 0.50 or less.

2. The semi-insulating gallium arsenide crystal substrate according to claim 1, wherein the coefficient of variation of the specific resistance is 0.10 or less for each of the first, second, and third measurement areas of the main surface.

3. The semi-insulating gallium arsenide crystal substrate according to claim 1, wherein the average value of the specific resistance is $1.0\times10^8$ Ω·cm or more for each of the first, second, and third measurement areas of the main surface.

4. The semi-insulating gallium arsenide crystal substrate according to claim 2, wherein
   the average value of the specific resistance is $1.0\times10^8$ Ω·cm or more for each of the first, second, and third measurement areas;
   the semi-insulating gallium arsenide crystal substrate has a dislocation density of $5.5\times10^3$ cm$^{-2}$ or less for each of the first, second, and third measurement areas; and
   the dislocation density is measured at each respective center of the first, second, and third measurement areas in a field of view of 1 mm square.

5. The semi-insulating gallium arsenide crystal substrate according to claim 4, wherein
the semi-insulating gallium arsenide crystal substrate has a Local Thickness Variation of 0.5 μm or less for each of the first, second, and third measurement areas; and wherein
the Local Thickness Variation is measured in a 20 mm square area having a center at each respective center of the first, second, and third measurement areas.

* * * * *